United States Patent [19]

Armstrong et al.

[11] Patent Number: 4,754,243

[45] Date of Patent: Jun. 28, 1988

[54] MICROWAVE COMPONENT MOUNTING

[75] Inventors: Albert L. Armstrong, Latham, N.Y.; William Moroney, Wenham, Mass.

[73] Assignee: M/A-COM, Inc., Burlington, Mass.

[21] Appl. No.: 819,932

[22] Filed: Jan. 21, 1986

Related U.S. Application Data

[62] Division of Ser. No. 649,946, Sep. 13, 1984, Pat. No. 4,581,250.

[51] Int. Cl.$^4$ .......................... H01P 1/22; H01P 5/00; H01P 11/00
[52] U.S. Cl. ................................. 333/250; 333/17 L; 333/252; 333/260; 174/52 FP
[58] Field of Search ...................... 333/17 L, 24 R, 27, 333/157, 208–212, 247, 248, 250, 252, 253, 258, 260, 81 B; 174/52 FP; 357/40

[56] References Cited

U.S. PATENT DOCUMENTS

| | | | |
|---|---|---|---|
| 3,163,835 | 12/1964 | Scott | 333/81 B |
| 3,721,923 | 3/1973 | Gray et al. | 333/157 |
| 4,475,007 | 10/1984 | Ohno | 174/52 FP |
| 4,571,559 | 2/1986 | Henry et al. | 333/17 L |
| 4,581,250 | 4/1986 | Armstrong et al. | 333/250 X |

FOREIGN PATENT DOCUMENTS 0140772 5/1985 European Pat. Off. .

OTHER PUBLICATIONS

Millimeter Wave High Power Solid State Limiter, by Armstrong & Anand, Microwave Journal, vol. 26, Mar. 1983; pp. 65–66, 68, 70, and 72.

Primary Examiner—Marvin L. Nussbaum
Attorney, Agent, or Firm—Wolf, Greenfield & Sacks

[57] ABSTRACT

A method of making a microwave semiconductor component and concurrently forming therewith a mounting membrane adapted for positioning the semiconductor component in an RF transmission medium such as a waveguide. Substantially concurrently with the deposition of a metallic film in connection with forming a semiconductor elements, there is deposited a metallic membrane on the base silicon substrate and outside of the circuit element. The outer periphery of the base substrate is removed to expose the membrane. The metallic membrane is preferably of gold.

19 Claims, 4 Drawing Sheets

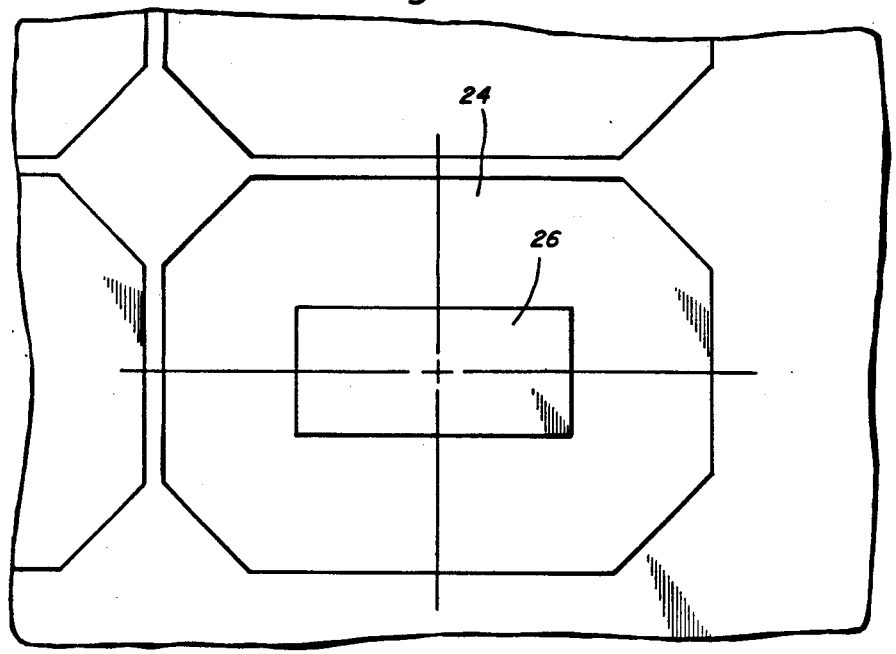
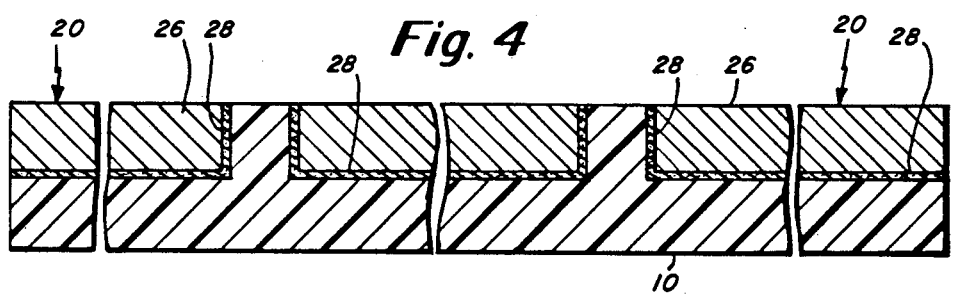
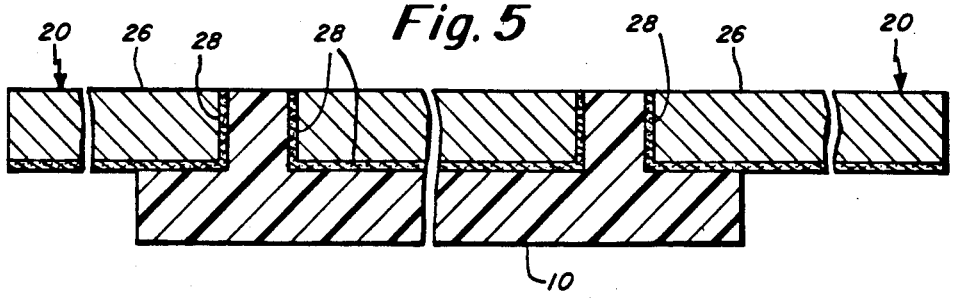

MICROWAVE COMPONENT MOUNTING

This application is a division of application Ser. No. 649,946, filed Sept. 13, 1984, now U.S. Pat. No. 4,581,250.

BACKGROUND OF THE INVENTION

The present invention relates in general to an improved technique for the mounting of millimeter microwave control and/or signal components into an RF transmission medium. More particularly, the present invention relates to an improved mounting system and associated method of manufacture particularly applicable at higher millimeter frequencies wherein microwave components are of substantially reduced size.

At the present time and in particular at lower millimeter frequencies, packaged devices are conventionally used and are readily mounted into a transmission medium such as into a length of waveguide using posts or mechanical transition pieces. At these lower frequencies this form of mounting is satisfactory and provides minimal performance degradation. However, at higher millimeter frequencies when the component dimensions are substantially reduced, it has been found that existing techniques are undesirable and in many instances are outright unworkable. These mounting techniques are undesirable because they cause degradation of electrical and mechanical parameters and are costly to implement. For example, not only is there the difficulty in handling smaller components, but there is also the ever present problem regarding undesirable electrical effects at these junction connecting points thus affecting the circuit operation.

By way of example, a high power limiter may be provided by placing a semi-conductor window control element across a waveguide. Fabricated into one surface of this window is a matrix of p-i-n diodes In the unbiased state, these diodes appear as a shunt capacitance across the waveguide. In the biased conducting state, the diodes produce a large admittance across the path of the millimeter wave. These semi-conductor window control elements may be mounted into a standard waveguide by several means including by direct soldering or by using a separately attached gold membrane peripheral frame. The gold membrane is provided with an opening to expose the window control element (diode array), and is bonded by soldering to the periphery of the silicon window chip. The window is placed into the waveguide (or a section of waveguide) and the gold membrane is clamped between two waveguide flanges. These techniques require at the very least some form of soldering or welding for affixing the semi-conductor chip to the frame-like membrane. As indicated previously, particularly at higher millimeter frequencies there is extreme difficulty in handling relatively small semi-conductor circuits and in providing effective connection to the gold membrane. As a result, undesirable electrical affects occur at these solder or weld points thus affecting the overall operability of the circuit.

OBJECTS OF THE INVENTION

Accordingly, it is an object of the present invention to provide an improved technique for the mounting of millimeter microwave control and/or signal components into an transmission media.

Another object of the present invention is to provide an improved mounting technique as in accordance with the preceding object and which is adapted to introduce very little RF loss.

A further object of the present invention is to provide an improved mounting technique as in accordance with the preceding objects and which is further characterized by having improved heat removal to the transmission medium.

Still another object of the present invention is to provide an improved mounting technique as set forth in the preceding objects and in which the mounting can be carried out in an easily reproducable manner and in a manner which is not labor intensive and thus relatively inexpensive.

Still a further object of the present invention is to provide an improved mounting arrangement for millimeter microwave components in which the supporting membrane is manufactured essentially concurrently with manufacture of the semiconductor chip itself thus minimizing the number of parts and associated steps necessary in forming a proper mounting for the component.

SUMMARY OF THE INVENTION

In accordance with the present invention there is provided an improved mounting technique in which there is essentially an integration of the device mounting means, in the form of a mounting membrane, with the fabrication process of the semi-conductor device itself. In this way the mounting structure is essentially batch fabricated with the semi-conductor device and does not require separate machining or separate attachment. Also, with the technique of the present invention there is provided intimate and integral contact of the membrane with the device thus providing very beneficial electrical and thermal properties. For higher millimeter frequencies, in particular, the techniques of the present invention provide a simpler mounting arrangement particularly for low RF loss control elements. In accordance with the invention there is provided a method of making a microwave semi-conductor component and concurrently forming therewith a mounting membrane adapted for positioning in an RF transmission medium. There is described in further detail hereinafter a method in particular of making a high frequency, high power limiting device constructed by placing a semi-conductor window control element across a waveguide. The method of the present invention comprises the steps of forming a semi-conductor circuit element including the sub-step of depositing a thin metallic film that defines part of the circuit element; the film being deposited on a base substrate. For example, in the construction of a high power limiter a semi-conductor chip has fabricated into one surface thereof a matrix of p-i-n diodes. A gold film is deposited to provide conductive paths between diodes. Substantially concurrently with the depositing of the metalic film there is also deposited a peripheral metalic film on the base substrate and outside of the circuit element. This peripheral metalic film later forms the aforementioned mounting membrane. In the basic steps there is then provided for the removal of the outer periphery of the base substrate, which in the above example is the semi-conductor chip, so as to expose the peripheral metalic film. As indicated this peripheral metalic film forms the mounting membrane and is formed integral with and in complete contact with the circuit element. In the preferred embodiment of the present invention the step of depositing the metalic film comprises the step of depositing gold. Also, in accordance with the present invention the method is preferably carried out for the formation of a plurality of circuit elements on a base substrate. In this connection the peripheral metalic film associated with each circuit element extends to define a gap with adjacent peripheral metalic films. In this way the circuit elements are individually readily separable upon removal of the outer periphery of the base substrate at each of the circuit elements. The aforementioned gap is easily formed by virtue of a mask that is employed in depositing the thin film gold membrane. Thus, the final step in fabrication of removal of the substrate carries out the dual purpose of forming the thin membrane and also enables ready dicing of the circuit wafer with attached membrane.

BRIEF DESCRIPTION OF THE DRAWINGS

Numerous other objects, features and advantages of the invention should now become apparent upon a reading of the following detailed description taken in conjunction with the accompanying drawings, in which:

FIG. 3 shows the mask that may be employed in forming the thin gold membrane in accordance with the present invention;

FIG. 4 is a cross-sectional view showing the construction of the bulk window device particularly at the periphery thereof wherein the membrane is formed;

FIG. 5 is a cross-sectional view similar to that of FIG. 4 but with the substrate removed so as to show the final formation of the membrane;

DETAILED DESCRIPTION

Figure 1:
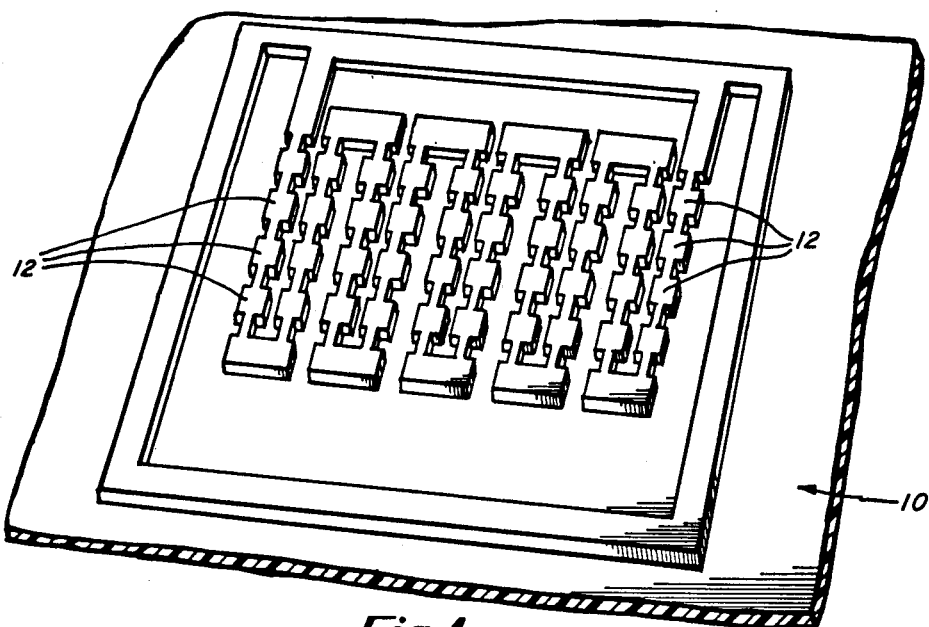
FIG. 1 is a top perspective view of a silicon wafer illustrating the etching pattern used in forming a window control element.

Referring now to the drawings, there is illustrated herein one embodiment for practicing the method of the present invention. In the particular embodiment described herein, there is shown the technique of the present invention as applied in the mounting of, for example, a limiter for high power millimeter-wave systems. However, it is understood that the principles of the present invention may be applied in mounting many different types of microwave components including by way of example, resistors, inductors, capacitors, transistors, or other types of microwave circuitry including such circuits as mixers, RF sources, switches, and detectors.

In accordance with the present invention there is provided for the integration of the device mounting means namely the mounting membrane, with the fabrication processes of the semi-conductor device itself. In this way the mounting structure can be batch fabricated with the semi-conductor device itself without the need for separate machining or attaching steps. Also, with the integrated mounting and fabrication technique of the present invention there is provided intimate contact between the mount and the device itself thus providing beneficial electrical and thermal properties of the overall structure. In accordance with the present invention, the mounting structure is simultaneously formed along with the forming of the electrical circuit itself. This provides the benefit of, as mentioned previously, batch fabrication. This also means that the overall product has fewer parts, there is less assembly effort required and there is better reproducability. There are also provided better junctions between the different materials and all of this is carried out at a lower cost. In addition, if the mounting structure is configured so as to minimize alteration of the RF field configuration, there is then generally less RF loss so with the techniques of the present invention.

It has also been found in accordance with the present invention that the membrane mount is useful in both TEM and waveguide transmission media. However, herein, the particular example provided is in waveguide transmission medium. Generally this is the more troublesome medium in which to provide the mounting of microwave components.

As indicated previously, in the example provided herein the technique for mounting the microwave components is described in association with a limiter for high power millimeter wave systems. The high power limiter comprises a semi-conductor window control element to be disposed in a waveguide. Fabricated into one surface of this window control element is a matrix of p-i-n diodes. In the unbiased state, these diodes appear as a shunt capacitance across the waveguide. On the other hand in the biased conducting state of the diodes, the diodes produce a large admittance across the path of the millimeter wave. The p-i-n diode array is fabricated into the surface of the silicon window. In this regard reference may be made to FIG. 1 which shows a silicon substrate 10 from which a plurality of circuits may be formed the majority of only one of which is depicted in FIG. 1. FIG. 1 shows the silicon being etched away from one surface so as to leave rectangular ridges 12 of silicon. It is to be understood that the diagram of FIG. 1 illustrates only one of the many steps employed in fabricating a circuit element such as the diode array depicted therein.

Figure 2:
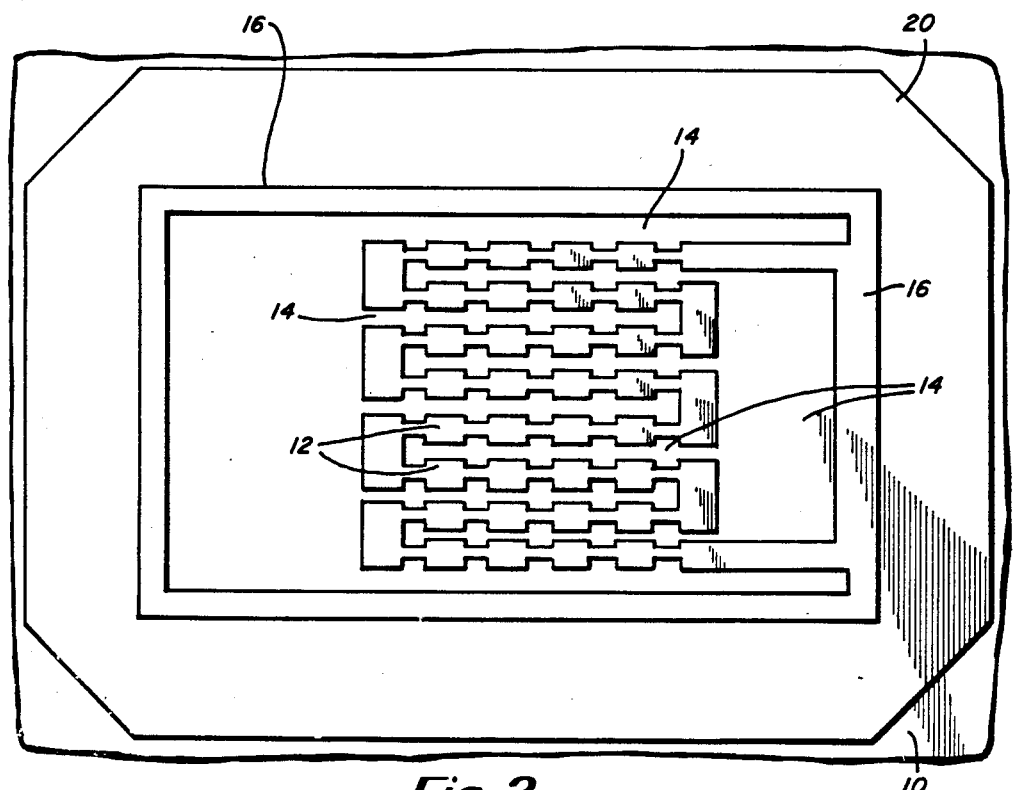
FIG. 2 is a plan view of the millimeter silicon bulk window limiter element FIG. 1.

FIG. 2 is a plan view illustrating the diode array also. The diodes are formed by doping. Parallel faces of the sides of these ridges are formed by using an orientation dependent etchant on (110) - silicon. The opposing side faces are doped with phosphorus or boron to produce the p-i-n diode bars.

Now, FIG. 2 is a plan view showing the construction of the semi-conductor circuit element after the silicon has been etched defining the ridges 12. FIG. 2 shows the hollow spaces between the ridges having been back filled with gold. The gold film is used as a conductor for the control bias current. In FIG. 2 the gold is shown at 14.

Note that, in this example, the gold is placed into channels etched into the semiconductor substrate. However, the gold could also be simply deposited onto the surface of the substrate without the need for etched channels.

The gold is deposited by electroplating and prior thereto the wafer may be metalized to accept the gold by sputtering titanium-gold.

In FIG. 2 it is noted that there is also provided a silicon edge 16 which essentially surrounds the circuit element. FIG. 2 also shows the thin gold film membrane 20 which may be considered essentially as extending from the silicon edge 16. The technique by which the membrane is formed is described in further detail hereinafter.

Reference may now be made to FIG. 3 which shows a mask by which the deposition of gold occurs. With this particular mask the gold is deposited in the frame area 24 and in the centrally disposed area 26 there is no gold deposition. It is in the area 26 that the circuit element is being formed. In the case of FIG. 2 this is the area in which is formed the p-i-n diode array. Of course, as part of the process in forming the diode array gold is deposited in the area 26. The mask shown in FIG. 3 may be used either for the deposition of the membrane metal separate from the deposition of the circuit metal 26, or the mask may be used for the deposition of additional gold, if needed, in the area 24 so as to provide a sufficient thickness of gold in the mounting membrane. The mounting membrane is of a size and shape corresponding substantially to the area 24 shown in FIG. 3. The metal composing the membrane mount may be deposited separately from or simultaneously with the circuit metalization.

Figure 6:
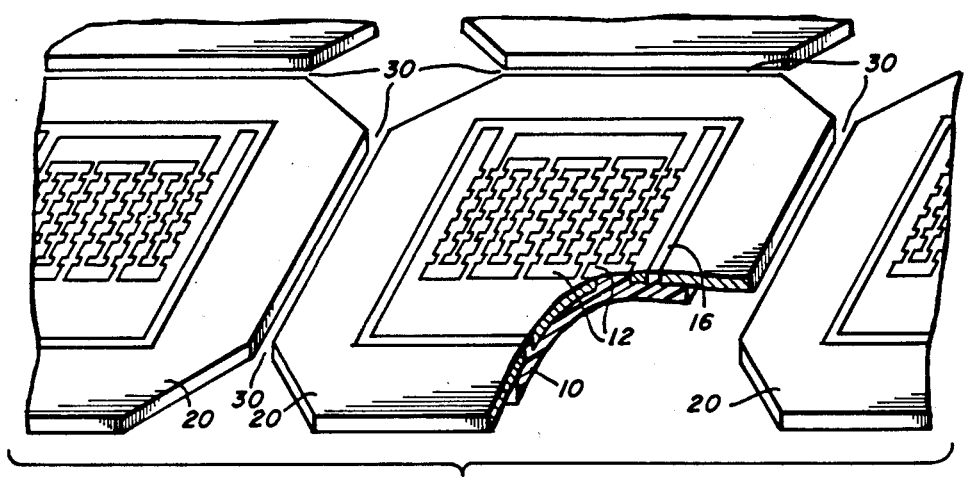
FIG. 6 is a perspective view illustrating the manner in which the membranes are formed along with the dicing of the silicon wafer.

For a better understanding of the method by which the mounting membrane is formed, reference may now be made to FIGS. 4–6. In FIGS. 4–6 there is shown the base silicon substrate 10 which as indicated previously, may be etched in the pattern illustrated in FIG. 2. As indicated previously, after the silicon pattern has been formed and the proper doping has been carried out, the resulting structure is an array of lateral p-i-n diodes. The wafer is then metalized by sputtering titanium-gold as indicated by the titanium-gold layer 28. FIGS. 4 and 5 also show the gold plating 26. It is noted that the plating 26 is formed by electroplating over the titanium-gold sputter layer 28. It is also noted that the plating 26 is deposited in the circuit area and furthermore extends at the periphery in FIG. 4 to cover the silicon substrate 10. In this connection in FIG. 4 the silicon substrate has not yet been etched away and initially the gold is electroplated over substantially the entire silicon substrate.

Now, FIG. 5 shows the silicon wafer having been etched away to thus leave the free membrane 20 extending peripherally and essentially integrally with the silicon wafer chip. FIG. 6 also illustrates the more or less final form of the circuit member including the substrate 10 and furthermore illustrating the thin gold membrane 20 which is integral with and extends from the silicon wafer chip. The titanium-gold layer 28 now exposed beneath the membrane 20 can be easily etched away if desired so as to provide improved electrical contact. It is moreover noted in FIG. 6 that the electroplating is carried out so as to leave a gap 30 between separate circuits. Before the silicon substrate is etched away all of the different circuits are held in a common unitary structure. However, upon the final etching step to remove the peripherally disposed silicon, this final step actually carries out two tasks. First, the final membrane 20 is formed. Second, when the silicon is etched away on opposite sides of the gap 30, then the wafer is essentially automatically diced.

Figure 7:
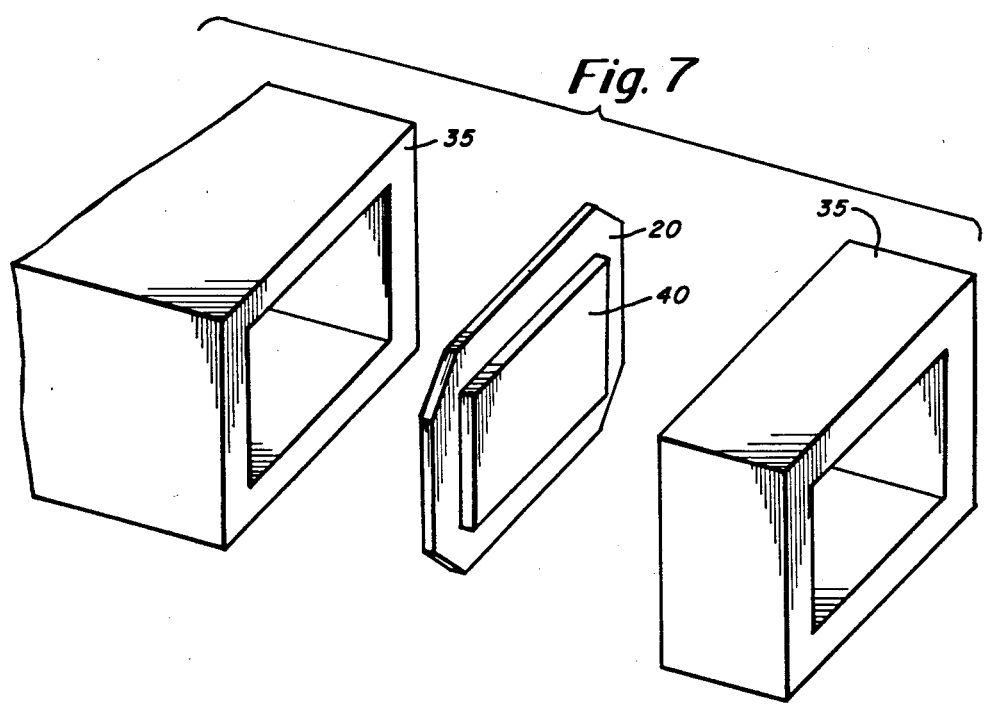
FIG. 7 is a perspective view illustrating the manner in which the microwave semi-conductor component is mounted in a waveguide.

The size and shape of the membrane may be easily controlled and it is dimensioned so that it can be easily secured into the waveguide. In the illustration of FIG. 7 the outer dimensions of the membrane 20 match that of the standard waveguide 35. The membrane may be secured to the waveguide by simply being clamped between two sections of waveguide such as the two sections illustrated in FIG. 7. Typically, the membrane is thin on the order of 0.001 inch and is of a soft metal, preferrably gold. By constructing the membrane of gold it will conform to the mating pieces and provide a low loss bond not requiring any soldering.

Also, as illustrated in FIG. 7, the silicon chip 40 to which the membrane 20 is integrally formed, is dimensioned substantially the same as the inner dimensions of the wave guide. By shaping the semi-conductor chip to the waveguide interior dimensions, there is provided a simple means of positioning the membrane properly. As is apparent from FIG. 7 the interface between the silicon chip and the membrane forms a shoulder and this shoulder is adapted to fit snuggly into the inner dimensions of the waveguide.

Figure 8:
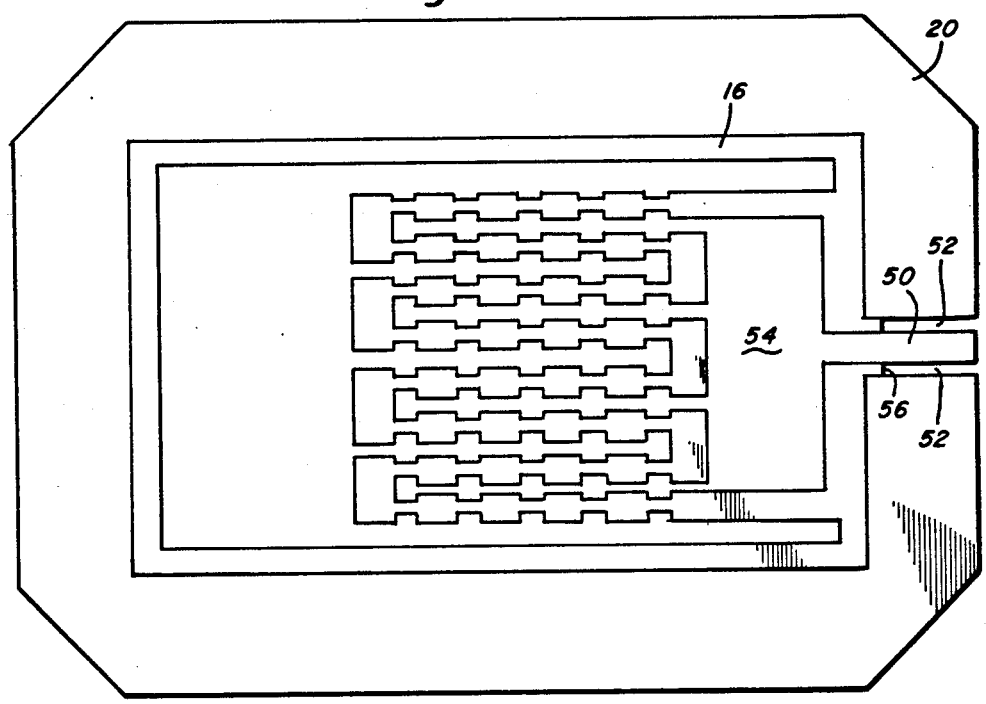
FIG. 8 shows an alternate embodiment of the invention similar to that described in FIG. 2 and further illustrating the use of the outer membrane as a means for conductive connection to the circuitry.

As indicated previously, the metalization of the membrane is deposited preferrably at substantially the same time as the metalization of the electrical circuit. If desired, for mechanical reasons, the membrane can be easily plated to greater thickness. This is where the mask of FIG. 3 may come into play for providing additional plating in the membrane area. It is also possible for the membrane to be electrically segmented and isolated for the introduction of control signals. In this regard reference may be made to the schematic diagram of FIG. 8 which shows the gold membrane 20 extending about the electrical circuit. There is provided an electrical circuit run 50 which may be isolated from the membrane 20 by virtue of spaced slots 52. To form the run 50, the silicon is etched where the run is to cross the silicon and the mask is formed so as to fill with gold to form the run 50 and thus bridge from the pad 54 to the membrane. The contact 50 thus couples from the biased pad 54. It is noted in FIG. 8 that the edge 56 of the underlying substrate is now visible. A similar arrangement can also be provided for providing contact to the other polarity of the circuit. The gold contact 50 may be isolated from the waveguide by virtue of insulation provided at the waveguide. This insulation may simply be in the form of a dielectric (in one embodiment varnish has been used) deposited on the mating walls of the waveguide or in a recessed channel machined into the waveguide.

The membrane mount of the present invention has been employed in association with the limiter construction described herein. There has been realized outstanding and reproduced performance at frequencies of 35 GHz and 94 GHz.

Having described one embodiment of the present invention, it should now be apparent to those skilled in the art that numerous other embodiments are contemplated. The concepts of the present invention may be employed in the mounting of various types of microwave components as now to be defined by the appended claims.

What is claimed is:

1. In combination, a microwave semiconductor component having a mounting membrane concurrently formed therewith, and an RF transmission medium including different joinable waveguide sections, said mounting membrane adapted for positioning the microwave semiconductor component in said RF transmission medium, said microwave semiconductor component comprising, a semiconductor circuit element including a base substrate and a thin metallic film that defines part of the circuit element and that is deposited over the base substrate, and a peripheral metallic film over the base substrate and outboard of the circuit element, the periphery of the base substrate being removed to expose the peripheral metallic film, said peripheral metallic film forming said mounting membrane and means clamping the peripheral metallic film between said waveguide sections for positioning said semiconductor circuit element inside of said RF transmission medium.

2. A combination as set forth in claim 1 wherein the metallic film comprises gold.

3. A combination as set forth in claim 1 including a plurality of semiconductor circuit elements and wherein the peripheral metallic film associated with each circuit element extends to define a gap with the adjacent peripheral metallic films.

4. A combination as set forth in claim 3 wherein the circuit elements are individually readily separable upon removal of the outer periphery of the base substrate associated with each circuit element.

5. A combination as set forth in claim 1 including a circuit run for conductive coupling from the cirucit element.

6. A combination as set forth in claim 1 wherein the depositing of the peripheral metallic film is carried out substantially concurrently with the depositing of the circuit metallic film.

7. A combinationa s set forth in claim 1 wherein the peripheral metallic film has opposite metallic surfaces exposed to permit the peripheral metallic film to be clamped between facing walls of the joinable waveguide sections.

8. A combination as set forth in claim 1 wherein said semiconductor circuit element is formed of a thickness greater than said peripheral metallic element and of a cross-sectional dimension to fit with close tolerance in said RF transmission medium.

9. A combination as set forth in claim 8 wherein said semiconductor circuit element defines a shoulder adapted to fit snugly into the inner dimensions of the RF transmission medium.

10. In combination, a microwave semiconductor component having a mounting membrane concurrently formed therewith, and an RF transmission medium including different sections, said mounting membrane adapted for positioning the microwave semiconductor component in said RF transmission medium, said microwave semiconductor component comprising a semiconductor circut element including a base substrate and a thin metallic film that defines part of the circuit element and that is deposited over the base substrate, and a peripheral metallic film outboard of the circuit element, said peripheral metallic element forming the mounting membrane and adapted to be clamped between said RF transmission medium sections, said peripheral metallic film having exposed opposite metallic surfaces that permit the peripheral metallic film to be clamped between facing walls of the RF transmission medium sections.

11. A combination as set forth in claim 10 wherein said semiconductor circuit element is formed of a thickness greater than said peripheral metallic element and of a cross-sectional dimension to fit with close tolerance in said RF transmission medium.

12. A combination as set forth in claim 11 wherein said semiconductor circuit element defines a shoulder adapted to fit snugly into the inner dimensions of the RF transmission medium.

13. A combination as set forth in claim 10 wherein the metallic film comprises gold.

14. A combination as set forth in claim 13 including a plurality of semiconductor circuit elements and wherein the peripheral metallic film associated with each circuit element extends to define a gap with the adjacent peripheral metallic films.

15. A combination as set forth in claim 14 wherein the circuit elements are individually readily separable upon removal of the outer periphery of the base substrate associated with each circuit element.

16. A combination as set forth in claim 10 including a circuit run for conductive coupling from the circuit element.

17. A combination as set forth in claim 10 wherein the depositing of the peripheral metallic film is carried out substantially concurrently with the depositing of the circuit metallic film.

18. A combination as set forth in claim 10 wherein the thin metallic film defining part of the circuit element and the peripheral metallic film are deposited substantially concurrently and the periphery of the base substrate is removed to expose the peripheral metallic film.

19. A combination as set forth in claim 18 wherein the depositing of the peripheral metallic film is carried out separately from the depositing of the thin metallic film.

* * * * *